US008538354B2

(12) United States Patent
Xu et al.

(10) Patent No.: US 8,538,354 B2
(45) Date of Patent: Sep. 17, 2013

(54) METHOD AND SYSTEM FOR CONTROLLING SIGNAL TRANSMISSION OF A WIRELESS COMMUNICATION DEVICE

(75) Inventors: Bing Xu, Gilbert, AZ (US); Pravin Premakanthan, Chandler, AZ (US)

(73) Assignee: Intel IP Corporation, Santa Clara, CA (US)

( * ) Notice: Subject to any disclaimer, the term of this patent is extended or adjusted under 35 U.S.C. 154(b) by 200 days.

(21) Appl. No.: 13/079,473

(22) Filed: Apr. 4, 2011

(65) Prior Publication Data
US 2012/0252520 A1 Oct. 4, 2012

(51) Int. Cl.
H04B 1/04 (2006.01)
H01Q 11/12 (2006.01)
H03F 3/68 (2006.01)
H03G 3/00 (2006.01)
H03G 3/20 (2006.01)

(52) U.S. Cl.
USPC .......... 455/127.1; 455/114.3; 455/127.2; 330/85; 330/127

(58) Field of Classification Search
USPC .......... 455/522, 114.3, 115.1, 115.3, 120, 455/122, 125, 126, 127.1, 127.2, 127.4; 370/318; 330/75, 85, 95, 127
See application file for complete search history.

(56) References Cited

U.S. PATENT DOCUMENTS

| 5,179,353 | A | | 1/1993 | Miyake | 330/129 |
|---|---|---|---|---|---|
| 5,287,555 | A | | 2/1994 | Wilson et al. | 455/115 |
| 5,296,821 | A | * | 3/1994 | Petersen et al. | 330/141 |
| 5,697,074 | A | | 12/1997 | Makikallio et al. | 455/126 |
| 5,898,339 | A | * | 4/1999 | Maruyama et al. | 330/151 |
| 6,553,213 | B1 | | 4/2003 | Kikuchi | 455/127 |
| 7,079,819 | B2 | | 7/2006 | Nagode et al. | 455/126 |
| 7,756,480 | B2 | * | 7/2010 | Loh | 455/63.1 |
| 2004/0176039 | A1 | * | 9/2004 | Leyh et al. | 455/67.11 |
| 2004/0198261 | A1 | * | 10/2004 | Xiong | 455/115.1 |
| 2004/0248528 | A1 | * | 12/2004 | Rozenblit et al. | 455/126 |
| 2005/0075077 | A1 | | 4/2005 | Mach et al. | 455/37.13 |
| 2006/0067427 | A1 | * | 3/2006 | Zolfaghari et al. | 375/297 |
| 2007/0032208 | A1 | * | 2/2007 | Choi et al. | 455/114.3 |
| 2009/0270137 | A1 | * | 10/2009 | Sorensen et al. | 455/572 |
| 2009/0289678 | A1 | * | 11/2009 | Pratt et al. | 327/170 |
| 2010/0105448 | A1 | * | 4/2010 | Andrys et al. | 455/571 |
| 2011/0021237 | A1 | * | 1/2011 | He et al. | 455/522 |
| 2012/0200354 | A1 | * | 8/2012 | Ripley et al. | 330/131 |

FOREIGN PATENT DOCUMENTS

| WO | WO 92/22133 | 12/1992 |
|---|---|---|
| WO | WO 2008/031454 | 3/2008 |

OTHER PUBLICATIONS

Extended European Search Report; Application No. 12154077.7-1233; pp. 7, Jul. 5, 2012.

* cited by examiner

*Primary Examiner* — Andrew Wendell
(74) *Attorney, Agent, or Firm* — Baker Botts L.L.P.

(57) ABSTRACT

In accordance with the present disclosure, disadvantages and problems associated with controlling signal transmission of a wireless communication device may be reduced. In accordance with an example embodiment of the present disclosure a method for controlling transmission of a wireless communication signal comprises sensing one or more signals indicative of a power level of a wireless communication signal. The power level of the wireless communication signal is amplified by a power amplifier according to an amplifier control signal. The method further comprises determining a change in the power level based on the one or more signals indicative of the power level. The change is associated with one or more perturbations of the amplifier control signal. The method also comprises adjusting transmission of the wireless communication signal according to the change in the power level.

24 Claims, 8 Drawing Sheets

METHOD AND SYSTEM FOR CONTROLLING SIGNAL TRANSMISSION OF A WIRELESS COMMUNICATION DEVICE

TECHNICAL FIELD

The present disclosure relates generally to mobile communication networks, and more particularly, to a method and system for controlling the transmit power of a wireless communication device.

BACKGROUND

Wireless communications systems are increasingly using multi-mode and multi-band transceivers to increase the data transmission capabilities of wireless communication devices. The output power of signals transmitted by these multi-band transceivers may be regulated by one or more power amplifiers included in the transceivers. These power amplifiers may amplify the output power as a function of a bias voltage applied to the power amplifiers. As the amount of bias voltage increases, the amplification or gain of the amplifier may increase. However, when the bias voltage reaches a certain level, increases in the bias voltage may result in little to no increases in the gain. When the amplifier reaches this state, the amplifier may be referred to as being in a saturation state or operating in saturation. While operating in saturation, the bias voltage may continue to increase while the amplifier gain only nominally increases. Therefore, when the power amplifier is operating in saturation although the bias voltage may increase, the signal power amplified by the power amplifier may plateau and reach its maximum level. This increase in bias voltage may cause the amplifier to increase its power consumption, which may reduce the battery life of the battery associated with the wireless communication device that includes the amplifier without providing any benefit, such as increased signal power.

Further, when the power amplifier operates in saturation the power amplifier may not deliver signal power in response to changes in the bias voltage or input signal power. In such instances, the mobile device may not reach the desired power level. Further, when the power amplifier is operating in saturation, the mobile device cannot respond to power control commands from the base-station. Moreover, during saturation, the transmit power control accuracy may degrade and may fail to meet network power vs. time specifications. Additionally, during saturation the power amplifier may not shut down and will degrade transient spectrum specifications due to sudden ramp down.

Additionally, as multi-mode and multi-band transceivers are used, the signals being transmitted by the transceivers may experience interference from on channel signals or co-band signals. These interfering signals may be referred to as "blockers." The interferer signals (blockers) may be external signals that may be from an adjacent channel user operating in another mobile protocol. For a mobile device operating in Wideband-Code Division Multiple Access (WCDMA) mode, an example of a blocker can be a Global System for Mobile Communications (GSM) mobile device, a Wireless Local Area Network (WLAN), a Bluetooth or a global positioning System (GPS) device. The blockers may cause the transmitted signals to not reach their intended destination and/or may render the signals unreadable.

SUMMARY

In accordance with the present disclosure, disadvantages and problems associated with controlling signal transmission of a wireless communication device may be reduced. In accordance with an example embodiment of the present disclosure a method for controlling transmission of a wireless communication signal comprises sensing one or more signals indicative of a power level of a wireless communication signal. The power level of the wireless communication signal is amplified by a power amplifier according to an amplifier control signal. The method further comprises determining a change in the power level based on the one or more signals indicative of the power level. The change is associated with one or more perturbations of the amplifier control signal. The method also comprises adjusting transmission of the wireless communication signal according to the change in the power level.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
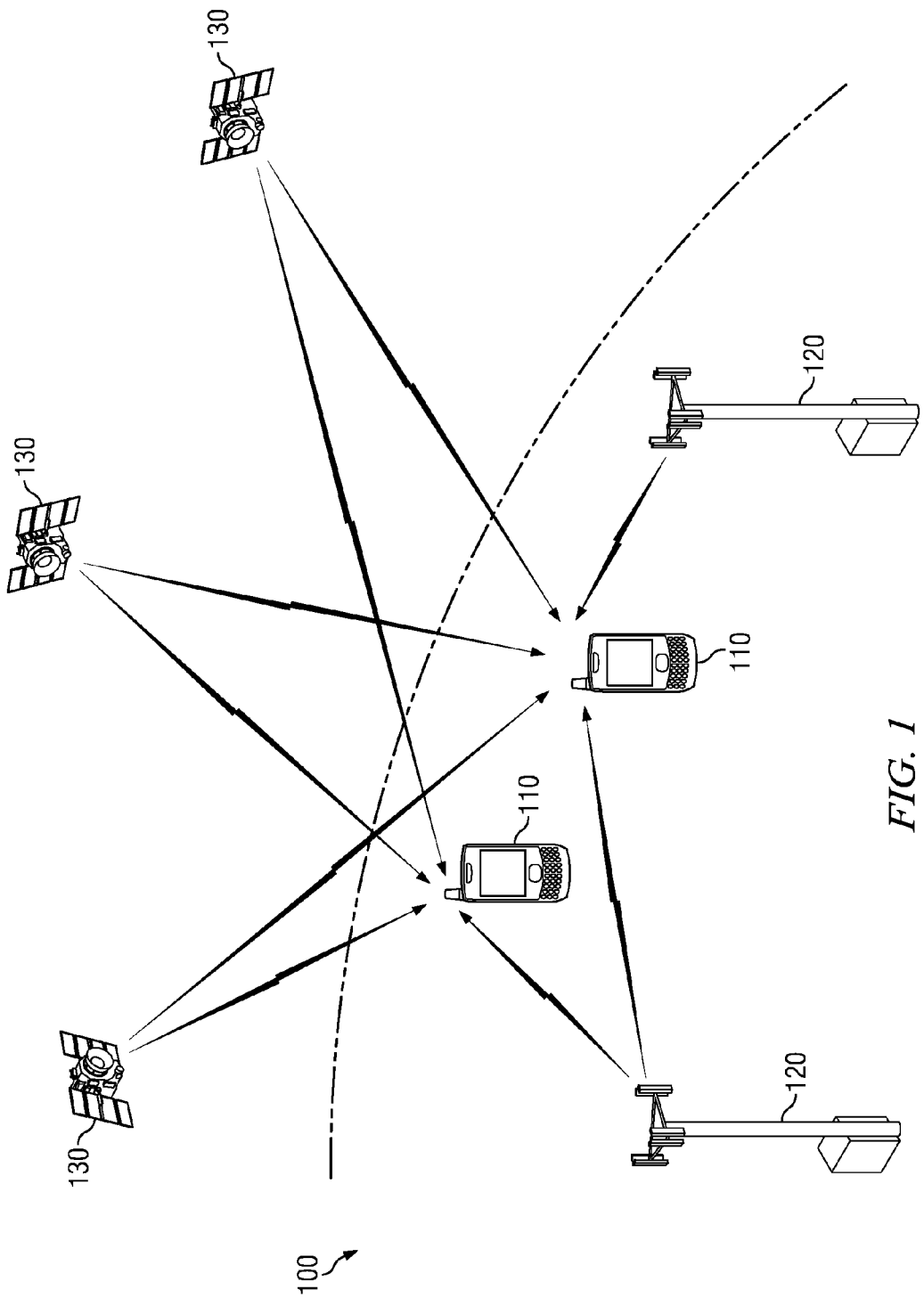
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

A terminal 110 may be configured to transmit signals to a base station 120 at varying signal power levels depending on a variety of parameters such that the base station 120 may receive the transmitted signal. Parameters that may affect required signal power may include the distance between the terminal 110 and the base station 120, environmental factors (e.g., weather), objects (e.g., trees, buildings, hills) and/or any other factor that may interfere with the transmitted signal as it propagates from terminal 110 to base station 120. In some instances the terminal 110 may attempt to boost the signal power in such a manner that the power amplifier (e.g., power amplifier 220 of FIG. 2a) associated with amplifying the signal reaches saturation. The terminal 110 may accordingly be configured to determine when the power amplifier is in saturation, and may adjust the power amplifier such that it no longer operates in saturation.

The power amplifier may amplify the output power as a function of a bias voltage applied to the power amplifier. As the amount of bias voltage increases, the amplification or gain of the amplifier may increase. However, as previously discussed, when the bias voltage reaches a certain level, increases in the bias voltage may result in little to no increases in the gain causing the amplifier to reach saturation. While operating in or near saturation, the bias voltage may continue to increase while the amplifier gain (and consequently the signal power) only nominally increases. Therefore, when the power amplifier is operating in saturation although the bias voltage may increase, the signal power amplified by the power amplifier may plateau and reach its maximum level. This increase in bias voltage may cause the amplifier to increase its power consumption, which may reduce the battery life of the battery of the terminal 110 without providing any benefit, such as increased signal power. Therefore, by removing the amplifier from saturation, terminal 110 may conserve power while also having little to no effect on the maximum signal power.

Further, when the power amplifier operates in saturation the power amplifier may not deliver signal power in response to changes in the bias voltage or input signal power. In such instances, the mobile device may not reach the desired power level. Further, when the power amplifier is operating in saturation, the mobile device cannot respond to power control commands from the base-station. Moreover, during saturation, the transmit power control accuracy may degrade and may fail to meet network power vs. time specifications. Additionally, during saturation the power amplifier may not shut down and will degrade transient spectrum specifications due to sudden ramp down. Accordingly, by detecting saturation of a power amplifier and removing it from saturation, one or more of these problems may be reduced or eliminated.

For example, a terminal 110 may be moving away from a base station 120, thus requiring the signal transmitted by terminal 110 to be increased in order for base station 120 to continue receiving the signal. The terminal 110 may accordingly increase the power of its transmitted signal by increasing the bias voltage of a power amplifier configured to amplify the transmitted signal. In some instances the terminal 110 may increase the bias voltage such that the power amplifier reaches saturation OR near saturation in an attempt to boost signal power as the terminal 110 moves further away from the base station 120. However, due to the inefficiencies associated with the amplifier operating in or near saturation, terminal 110 may also be configured to detect when the amplifier is operating in or near saturation and may decrease the bias voltage such that the amplifier may operate outside of saturation. It is understood that this is just an example of when a terminal 110 may increase transmitted signal power and that a power amplifier associated with boosting signal power may enter saturation for a variety of reasons.

Additionally, a terminal 110 may be configured to operate as a multi-mode and/or multi-band transceiver. Consequently, the signals being transmitted by the terminal 110 may experience interference from on channel signals or co-band signals. These interfering signals may be referred to as "blockers." Additionally, as multi-mode and multi-band transceivers are used, the signals being transmitted by the transceivers may experience interference from on channel signals or co-band signals. These interfering signals may be referred to as "blockers." The interferer signals (blockers) may be external signals that may be from an adjacent channel user operating in another mobile protocol. For a mobile device operating in WCDMA mode, an example of a blocker can be a GSM mobile device, WLAN, Bluetooth or GPS device. The blockers may cause the transmitted signals to not reach their intended destination and/or may render the signals unreadable. The blockers may cause the transmitted signals to not reach their intended destination (e.g., a base station 120) and/or may render the signals unreadable.

Accordingly, as discussed in further detail below, terminal 110 may be configured to determine when one or more blockers are present and may appropriately delay signal transmission upon detecting the presence of a blocker. During blocker detection, terminal 110 may be configured to delay power control updates made to digital and RF gain control stages. Further, antenna tuner updates may not be performed for the present transmission slot and saturation detection control updates may be delayed. Additionally, dynamic phase estimation circuitry of terminal 110 may be put on a hold mode.

Figure 2A:
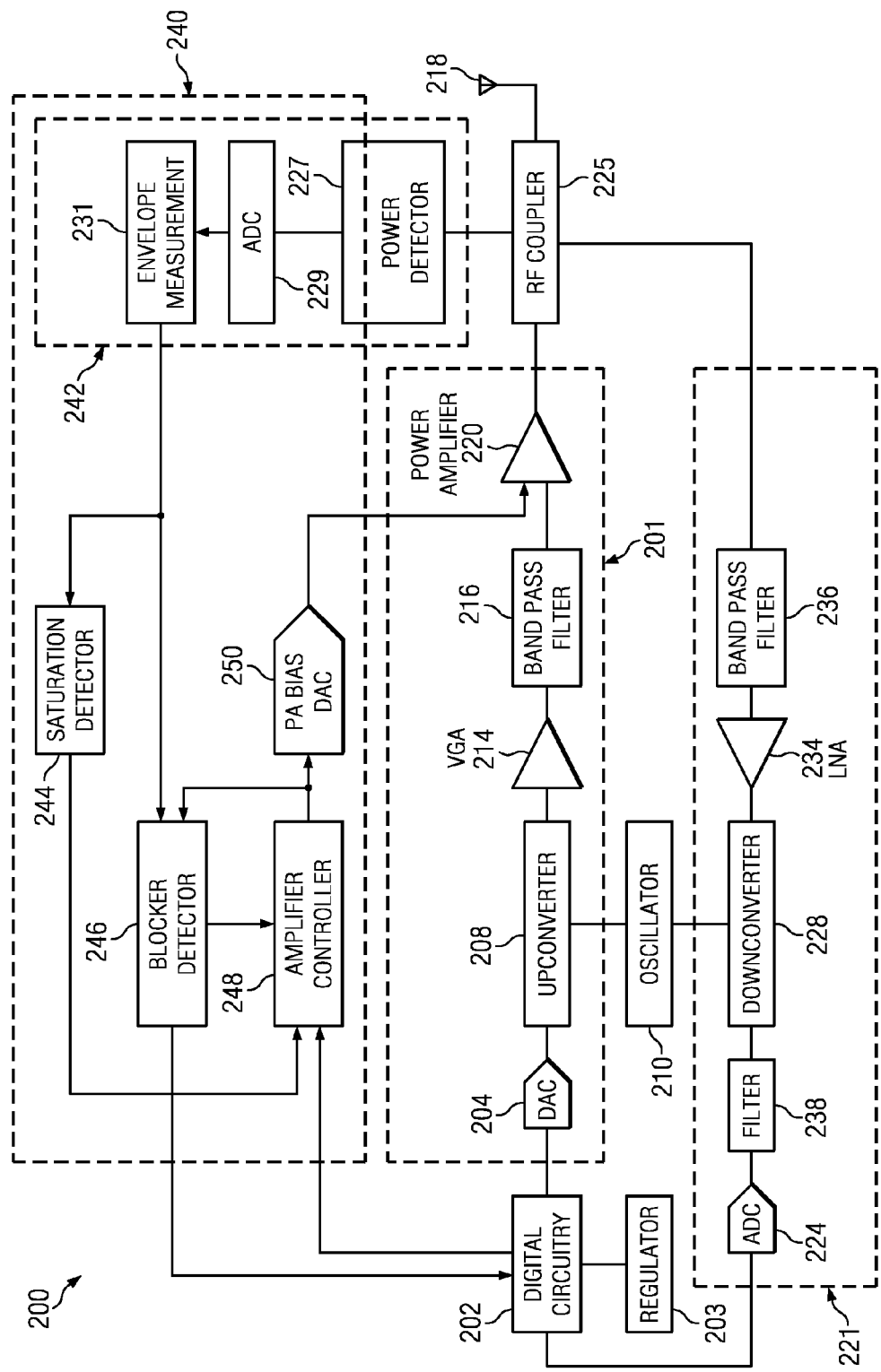
FIG. 2a illustrates a block diagram of selected components of an example transmitting and/or receiving element, in accordance with certain embodiments of the present disclosure.

FIG. 2a illustrates a block diagram of selected components of an example transmitting and/or receiving element 200

(e.g., a terminal 110, a base station 120, or a satellite 130), configured to detect saturation of a power amplifier associated with signal transmission and/or configured to detect signal blockers. By detecting power amplifier saturation and/or signal blockers, terminal 200 may perform appropriate actions to mitigate undesirable effects associated with power amplifier saturation and/or blockers.

Element 200 may include a transmit path 201 and/or a receive path 221. Depending on the functionality of element 200, element 200 may be considered a transmitter, a receiver, or a transceiver. Element 200 may also include a control path 240 configured to determine saturation of a power amplifier 220 associated with transmit path 201, as discussed further below. Control path 240 may also be configured to detect blockers associated with transmitting signals via transmit path 201, as described in more detail below.

Digital circuitry 202 may include any system, device, or apparatus configured to process digital signals and information received via receive path 221 (communicative coupling not expressly shown), and/or configured to process signals and information for transmission via transmit path 201. Such digital circuitry 202 may include one or more microprocessors, digital signal processors, and/or other suitable devices. As discussed in further detail below, digital circuitry 202 may be configured to control the gain of power amplifier 220 configured to amplify one or more wireless communication signals. Additionally, as discussed in further detail below, digital circuitry 202 may be configured to receive information indicating that a blocker is present, and may perform various operations in response to receiving that information.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at a radio frequency based on an oscillator signal provided by oscillator 210. Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal. In some embodiments, oscillator 210 may be a digitally-controlled crystal oscillator.

Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission.

The amplified signal may be received by a radio frequency (RF) coupler 225 coupled between power amplifier 220 and antenna 218. RF coupler 225 may be any system, device or apparatus configured to couple at least a portion of the transmission power in the transmission line between power amplifier 220 and antenna 218 and send that transmission power to a signal measurement path 242 of control path 240 described in further detail. RF coupler 225, may also couple the remaining portion of the amplified signal received from power amplifier 220 and send it to antenna 218. Antenna 218 may receive the amplified signal from coupler 225 and transmit such signal (e.g., to one or more of a terminal 110, a base station 120, and/or a satellite 130). The signal amplified by power amplifier 220 and transmitted by antenna 218 may be referred to as an RF signal or a transmitted signal.

Receive path 221 may include a bandpass filter 236 configured to receive a wireless communication signal (e.g., from a terminal 110, a base station 120, and/or a satellite 130) via antenna 218 and RF coupler 225. RF coupler 225 may couple at least a portion of the signal received at antenna 218 and may send it to bandpass filter 236. Bandpass filter 236 may pass signal components in the band of interest and remove out-of-band noise and undesired signals. In addition, receive path 221 may include a low-noise amplifiers (LNA) 224 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal).

Receive path 221 may further include a filter 238, which may be configured to filter a downconverted wireless communication signal in order to pass the signal components within a radio-frequency channel of interest and/or to remove noise and undesired signals that may be generated by the downconversion process. In addition, receive path 221 may include an analog-to-digital converter (ADC) 224 configured to receive an analog signal from filter 238 and convert such analog signal into a digital signal. Such digital signal may then be passed to digital circuitry 202 for processing.

As discussed in further detail below, the gain of power amplifier 220 may be a function of a control signal received from control path 240. In some embodiments, the control signal may comprise a bias voltage configured to control the gain of power amplifier 220. In such embodiments, generally as the bias voltage increases, the gain of power amplifier 220 may also increase.

Figure 3:
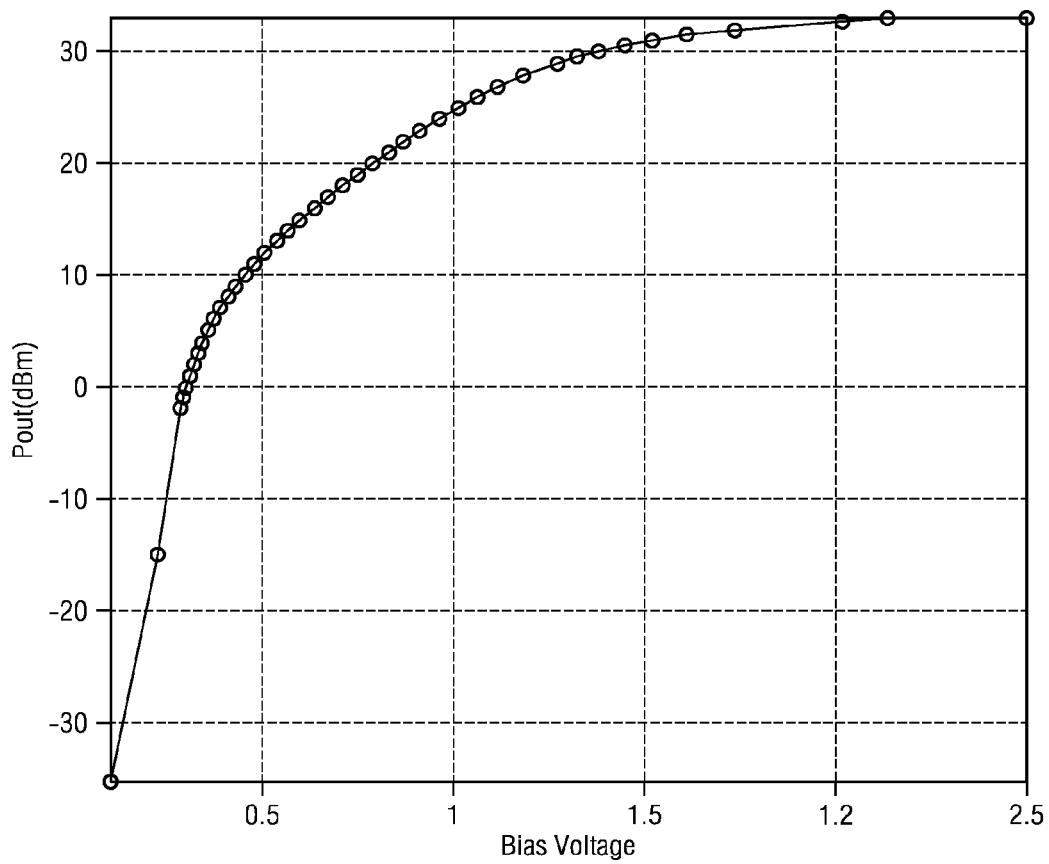
FIG. 3 illustrates an example graph depicting the gain of a power amplifier with respect to a bias voltage applied to the power amplifier in accordance with certain embodiments of the present disclosure.

FIG. 3 illustrates an example graph depicting the gain of a power amplifier (e.g., power amplifier 220) with respect to a bias voltage applied to the power amplifier. In the graph, the bias voltage is generally represented by the x-axis and the gain in dBm (measured power level in decibels relative to one milliwatt (mW)) is generally represented by the y-axis. From the graph it can be seen that when the bias voltage is relatively small, an increase in the bias voltage may yield a relatively high increase in the gain of the power amplifier. When the amplifier is operating in this state, it may be referred to as operating in a high slope state because the rate of change of the gain with respect to a change in the bias voltage may be relatively high.

From the graph it can also be seen that as the bias voltage increases, the increase in gain starts to increase at a slower rate than when the bias voltage is relatively small. At this state, the increase in bias voltage may lead to a relatively linear increase in gain of the power amplifier, such that this state may be referred to as a linear slope state. However, it can also be seen from the graph of FIG. 3 that as the bias voltage continues to increase, the gain of the power amplifier may have little to no increase compared to the increase in bias voltage. When the amplifier operates in this state, the amplifier may be referred to as operating in a low slope state which may indicate that the amplifier is operating in or near a saturated state or in saturation.

Returning to FIG. 2a, as discussed in further detail below, in some embodiments, control path 240 may be configured to determine when power amplifier 220 is operating in or near saturation (e.g., in a low slope state) based on changes in the output of power amplifier 220 with respect to changes in the bias voltage controlling the gain of power amplifier 220. For example, if the bias voltage changes and the output of power amplifier 220 experiences little to no change, control path 240 may determine that power amplifier 220 is operating in or near saturation. Control path 240 may accordingly be configured to adjust the bias voltage of power amplifier 220 to remove power amplifier 220 from saturation or near saturation (e.g., move amplifier 220 from a low slope state to a linear state).

As discussed in further detail below, control path 240 may also be configured to determine whether any signal blockers are present and direct element 200 to perform operations accordingly.

Control path 240 may include an amplifier controller 248 configured to control the gain of power amplifier 220. In some embodiments, amplifier controller 248 may comprise any system, device, or apparatus configured to interpret and/or execute program instructions and/or process data, and may include without limitation a microprocessor, microcontroller, digital signal processor (DSP), application specific integrated circuit (ASIC), or any other digital or analog circuitry configured to interpret and/or execute program instructions and/or process data. In some embodiments, amplifier controller 248 may interpret and/or execute program instructions and/or process data (e.g., amplifier 220 control instructions) stored in memory communicatively coupled to amplifier controller 248 (not expressly shown).

Memory may comprise any system, device or apparatus operable to retain program instructions or data for a period of time (e.g., computer-readable media). Memory may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to amplifier controller 248 is turned off.

As mentioned above, amplifier controller 248 may be configured to control the gain of amplifier 220 with a control signal. In some such embodiments, amplifier controller 248 may comprise a controller configured to generate a digital control signal to control the bias voltage of amplifier 220. As such, control path 240 may also include a power amplifier (PA) bias digital to analog converter (DAC) 250 coupled between amplifier controller 248 and power amplifier 220. DAC 250 may comprise any suitable system, apparatus or device configured to receive a digital bias voltage control signal from amplifier controller 248, convert the bias voltage control signal to analog form and communicate it to power amplifier 220 as the bias voltage of power amplifier 220.

Figure 4:
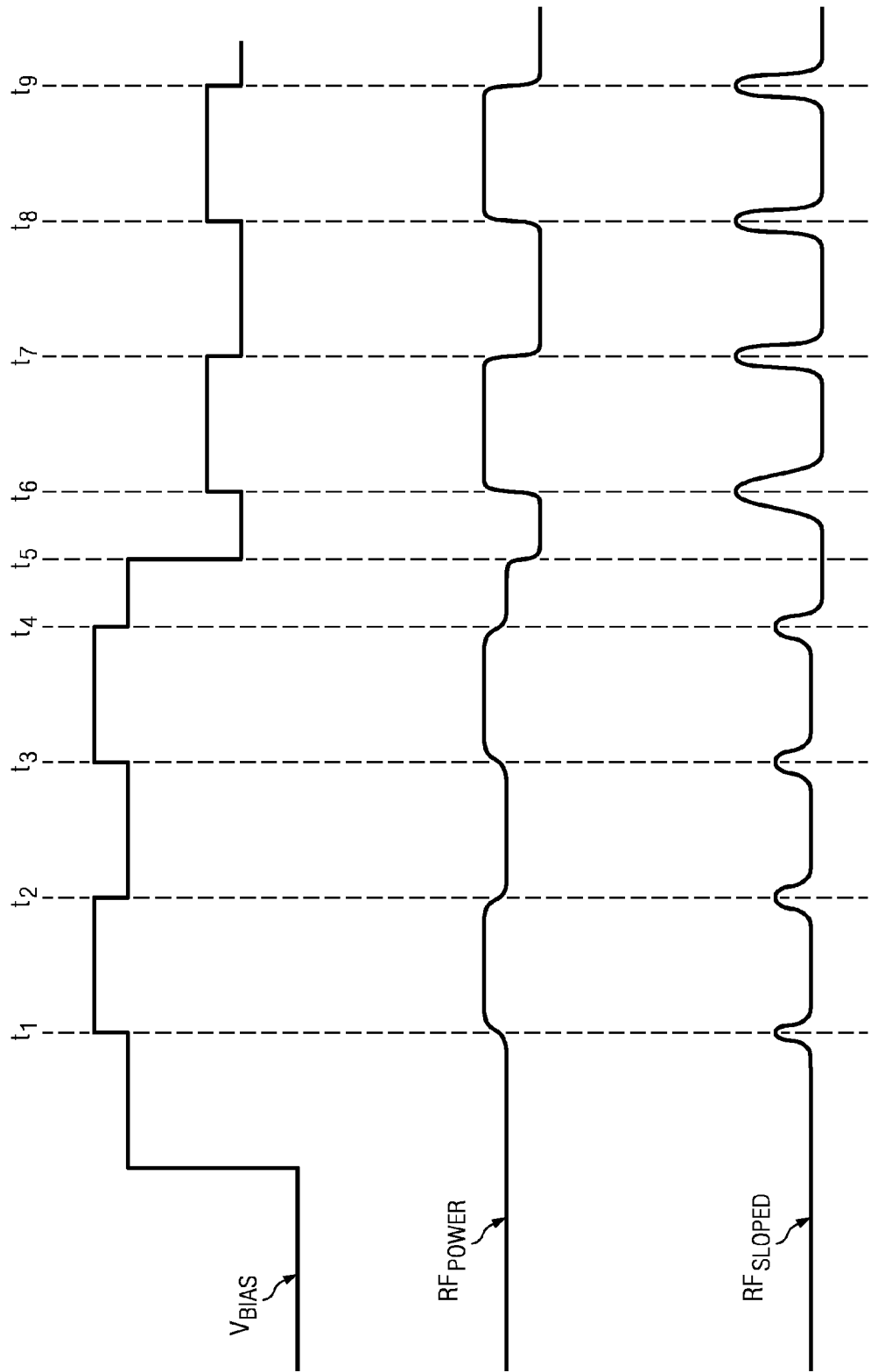
FIG. 4 illustrates an graph depicting an example of the bias voltage of a power amplifier, the measured power of a wireless signal amplified by the power amplifier according to the bias voltage, and the magnitude of change of the wireless signal associated with changes in the bias voltage in accordance with certain embodiments of the present disclosure.

Amplifier controller 248 may be configured to generate a bias voltage that includes small pulses or perturbations (shown in more detail with respect to FIG. 4). The perturbations may cause the gain of amplifier 220 to change with respect to the perturbations, which may accordingly cause pulses or perturbations in the RF signal amplified by amplifier 220. As described more fully with respect to FIG. 4, the degree of change in the power of the signal amplified by amplifier 220 (associated with the perturbations in the bias voltage) may indicate the operating state of amplifier 220.

For example, if the signal power changes at an approximately linear scale compared to the changes in the bias voltage due to the perturbations, amplifier 220 may be operating in a linear slope state where the gain of amplifier 220 has a relatively linear relationship with respect to the bias voltage, as described with respect to FIG. 3. As another example, if the signal power changes at a relatively small scale compared to changes in bias voltage associated with the perturbations, amplifier 220 may be operating in or near saturation (e.g., in a low slope state). As discussed in further detail below, a saturation detector 244 may be configured to determine if amplifier 220 is operating in saturation based on the perturbations associated with the bias voltage and the output power of amplifier 220.

Additionally, the perturbations may be used to detect whether or not a blocker is present. A blocker may cause the perturbations (associated with the perturbations in the bias voltage) in the signal amplified by amplifier 220 to be blocked or masked while being detected by a signal detection system (described in further detail below). Accordingly, by comparing the bias voltage and its perturbations with the detected signal amplified by amplifier 220, a blocker may be detected. As explained below, blocker detector 246 may be configured to detect blockers based on the bias voltage perturbations and perturbations of the measured output signal of amplifier 220.

Amplifier controller 248 may also be communicatively coupled to digital circuitry 202 and may be configured to adjust the gain of power amplifier 220 as instructed by digital circuitry 202. For example, element 200 may comprise a terminal (e.g., a terminal 110 of FIG. 1), transmitting signals to a base station (e.g., a base station 120 of FIG. 1). Element 200 may be moving away from the base station such that the power of the transmitted signals may need to be increased to reach the base station. Accordingly, the base station may instruct (via receive path 221) digital circuitry 202 of element 200 to increase the transmitted signal power. Digital circuitry 202 may instruct amplifier controller 248 to adjust the gain of power amplifier 220 to increase the signal power of the transmitted signal. Amplifier controller 220 may accordingly increase the bias voltage of amplifier 220 to increase the gain of amplifier 220.

As discussed in more detail below, amplifier controller 248 may also be communicatively coupled to saturation detector 244 and blocker detector 246 included in control path 240. Amplifier controller 248 may be configured to receive instructions from saturation detector 244 and/or blocker detector 246 and may adjust the gain of power amplifier 220 according the instructions received from saturation detector 244 and/or blocker detector 246. Further, as discussed in more detail below, saturation detector 244 and blocker detector 246 may be configured to generate instructions for amplifier controller 248 according to one or more signals received from a signal measurement path 242 included in control path 240.

Signal measurement path 242 may comprise any suitable system, apparatus, or device configured to measure the RF signal leaving power amplifier 220 and being transmitted by antenna 218.

For example, in the present embodiment of FIG. 2a, signal measurement path 242 may be coupled to coupler 225 to receive at least a portion of the signal being amplified by power amplifier 220 and transmitted by antenna 218. Signal measurement path 242 may comprise a signal power path that includes an RF power detector 227 configured to measure the power of the transmitted signal by converting the RF power of the transmitted signal into DC voltage by using envelope detection. Signal measurement path 242 may also include an ADC 229 configured to convert the measured power into a digital signal to make it suitable for any digital signal processing.

Signal measurement path 242 may also may also include an envelope measurement unit 231 communicatively coupled to ADC 229 and configured to receive signals from ADC 229. Envelope measurement unit 231 may comprise any suitable system, apparatus or device (e.g., a microcontroller, DSP etc.) configured to measure the digital envelope of the signals received from ADC 229. The digital envelope may indicate the RF power of the signal amplified by power amplifier 220.

Envelope measurement unit 231 may be communicatively coupled to saturation detector 244 and blocker detector 246 and may communicate the digital envelope indicating the RF power to saturation detector 244 and/or blocker detector 246. As described in further detail below, saturation detector 244 and blocker detector 246 may respectively detect saturation of power amplifier 220 and blockers according to the signal power indicated by the digital signal sent by signal measurement path 242.

Figure 2B:
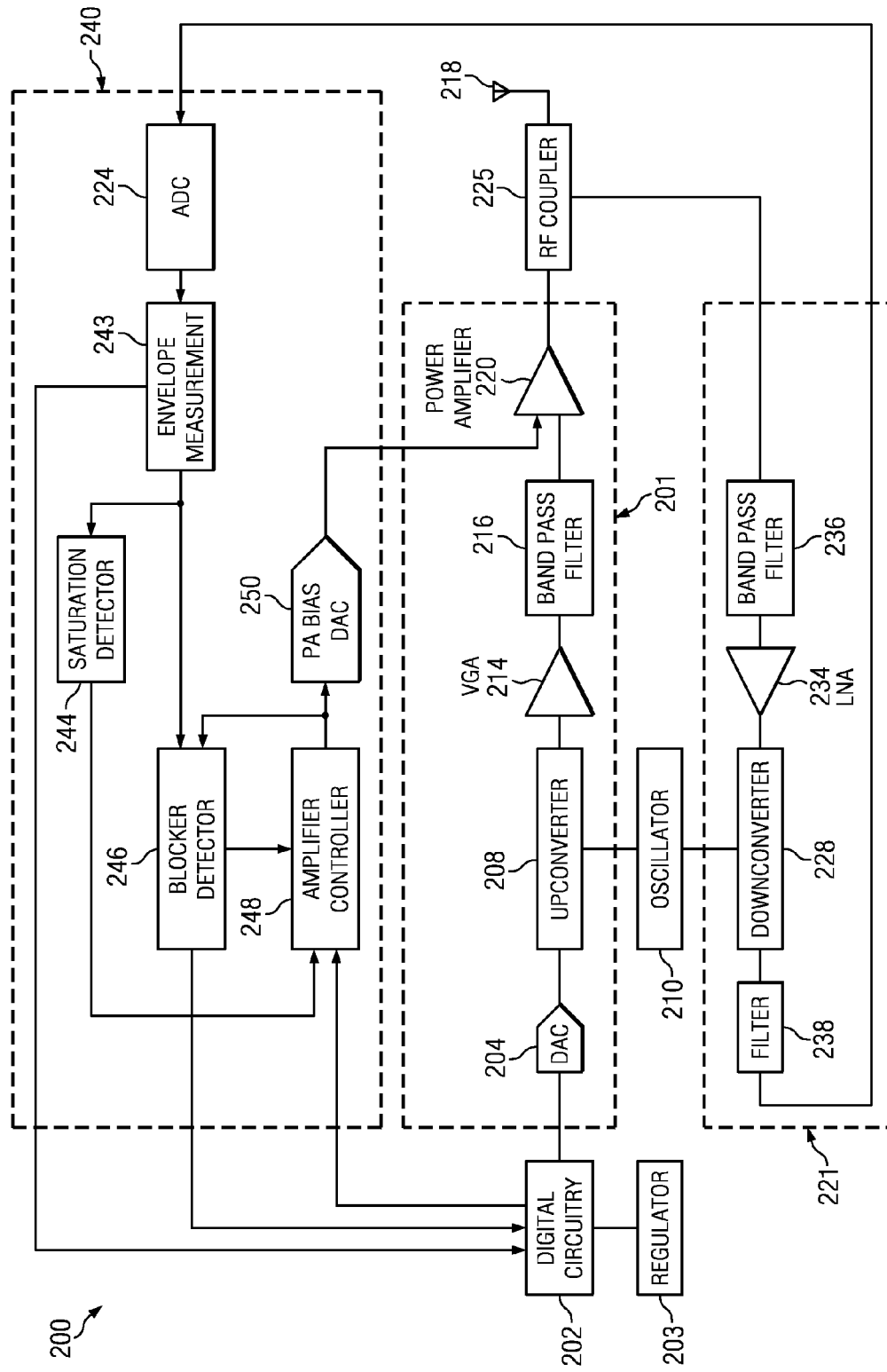
FIG. 2b illustrates an alternative embodiment of a transmitting and/or receiving element in accordance with certain embodiments of the present disclosure.

FIG. 2b illustrates an alternative embodiment of element 200 where the RF signal leaving power amplifier 220 and being transmitted by antenna 218 may be measured by a feedback receive path. Element 200 of FIG. 2b may be substantially similar to element 200 of FIG. 2a, however, instead of including signal measurement path 242 like element 200 of FIG. 2a, element 200 of element 2b may use receive path 221 as a feedback receive path to detect the signal power of the signal amplified by power amplifier 220 and transmitted by antenna 218 in FIG. 2b. Therefore, receive path 221 of FIG. 2b may perform one or more operations of signal measurement path 242 of FIG. 2a.

In FIG. 2b, control path 240 may include receive path 221. Receive path 221 may be configured to receive from RF coupler 225 a portion of the RF signal amplified by power amplifier 220. While operating as a feedback receive path of the RF signal amplified by power amplifier 220 in FIG. 2b, bandpass filter 236, LNA 234, downconverter 228, filter 238 and ADC 224 may perform operations on the RF signal associated with power amplifier 220 similar to those operations described above in FIG. 2a with respect to received signals.

Receive path 221 of FIG. 2b may also include an envelope measurement unit 243 substantially similar to envelope measurement unit 231 in FIG. 2a and communicatively coupled to ADC 224. Accordingly, envelope measurement unit 243 of FIG. 2b may comprise any suitable system, apparatus or device (e.g., a microcontroller, DSP etc.) configured to receive signals from ADC 224 and measure the digital envelope of the signals received from ADC 224. The digital envelope may indicate the RF power of the signal amplified by power amplifier 220.

Similar to envelope measurement unit 231 of FIG. 2a, envelope measurement unit 243 of FIG. 2b may be communicatively coupled to saturation detector 244 and blocker detector 246 and may communicate the digital envelope indicating the RF power to saturation detector 244 and/or blocker detector 246. As described in further detail below, saturation detector 244 and blocker detector 246 may respectively detect saturation of power amplifier 220 and blockers according to the signal power indicated by the digital envelope. Unlike envelope measurement unit 231 of FIG. 2a, envelope measurement unit 243 of FIG. 2b may also be communicatively coupled to digital circuitry 202 such that digital circuitry 202 may process signals received by receive path 221 via antenna 218, when signals are being received by antenna 218 instead of transmitted by antenna 218.

Therefore, receive path 221 including envelope measurement unit 243 of FIG. 2b may act as a feedback receive path that may be used to detect the RF signal power of the signal amplified by power amplifier 220 and transmitted by antenna 218 instead of signal measurement path 242 of FIG. 2a. Additionally, the remaining elements of FIGS. 2a and 2b may be substantially similar. Accordingly, to facilitate the description of the present disclosure, the remaining description will be made with respect to signal measurement path 242 and FIG. 2a, but it is understood that in the description, signal measurement path 242 may be substituted for a feedback receive path, such as described with respect to FIG. 2b.

Returning to FIG. 2a, as described above signal measurement path 242 of FIG. 2a may be configured to sense one or more signals that are indicative of the power level of RF signals transmitted by antenna 218 and amplified by power amplifier 220. Additionally, as described above, signal measurement path 242 may also be configured to generate one or more signals indicative of the RF signal power based on the sensed signals. In the present embodiment, while detecting the RF signal power of a signal leaving amplifier 220, signal measurement path 242 may detect the perturbations in the RF signal associated with the perturbations of the bias voltage received by power amplifier 220.

As mentioned above, signal measurement path 242 of FIG. 2a may be communicatively coupled to saturation detector 244 and blocker detector 246 such that saturation detector 244 and blocker detector 246 may receive the digitized signals from signal measurement path 242 and perform digital signal processing on the signals as discussed further below. Saturation detector 244 and blocker detector 246 may be configured to respectively detect whether amplifier 220 is operating in saturation and whether a blocker is present based on the perturbations of the RF signal as detected by signal measurement path 242.

Saturation detector 244 may comprise any suitable system, apparatus or device configured to determine that amplifier 220 is operating in saturation based on the perturbations of the RF signal as measured by measurement path 242. In some embodiments, saturation detector 244 may determine that amplifier 220 is operating in saturation according to signals and operations described with respect to FIG. 4.

FIG. 4 illustrates a graph depicting an example of the bias voltage ($V_{Bias}$) of amplifier 220, the measured RF power ($RF_{Power}$) of the transmitted signal as measured by signal measurement path 242 and the magnitude of the of change ($|RF_{Change}|$) of the transmitted signal. As discussed above, the bias voltage may include small pulses or perturbations that occur in a periodic nature. These perturbations can be seen as occurring in $V_{Bias}$ between times t1 and t2, t3 and t4, t6 and t7, and t8 and t9 in FIG. 4. Additionally, as discussed above, the perturbations in $V_{Bias}$ may also cause perturbations in the power of the RF signal being amplified by amplifier 220. These perturbations can also be seen as occurring in $RF_{Power}$ between times t1 and t2, t3 and t4, t6 and t7, and t8 and t9 in FIG. 4.

Each time the RF signal changes based on a perturbation of the bias voltage, the magnitude of the change of the RF signal may be depicted as $|RF_{Change}|$. The magnitude of the change may also be referred to as the slope energy. The slope energy may be the absolute value of the change in the RF signal to indicate the degree of change of the RF signal (e.g., degree of an increase or decrease of the RF signal) with respect to either an increase or decrease in the bias voltage. As mentioned previously and shown in FIG. 3, depending on the operating state of amplifier 220, an increase or decrease in the bias voltage may cause the RF signal power to increase or decrease by varying degrees. The slope energy may indicate the degree of an increase or decrease of the signal power based on a respective increase or decrease of the bias voltage and, therefore, may indicate the operating state of amplifier 220.

For example, when amplifier 220 is operating outside of saturation (e.g., in a linear or high slope state), the amount of change in the RF signal power with respect to a change in the bias voltage may be greater than when amplifier 220 is operating in or near saturation (e.g., in a low slope state). Therefore, the slope energy may indicate the operating state of amplifier 220 by indicating a higher change in the signal power when amplifier 220 is out of saturation than when amplifier 220 is in saturation. The slope energy associated with the changes in the signal power due to the perturbations of the bias voltage may be seen at times t1, t2, t3, t4, t6, t7, t8 and t9 with respect to $|RF_{Change}|$ of FIG. 4.

Saturation detector 244 may be configured to determine the slope energy of an RF signal and may accordingly determine whether power amplifier 220 is in saturation based on the slope energy. For example, in FIG. 4 at time t1, the bias voltage may increase based on the periodic perturbation of the bias voltage. The RF signal power may also increase a particular amount based on the increase in the bias voltage. Saturation detector 244 may determine the slope energy of the change in the signal power and may compare that value with a threshold value. The threshold value may be associated with a slope energy—due to the perturbation at time t1—that indicates that power amplifier 220 is operating in or near saturation.

If the slope energy is less than the threshold, saturation detector 244 may determine that power amplifier 220 is operating in saturation. In the present example, at time t1, the slope energy may be less than the threshold value. Accordingly, in the present example, saturation detector 244 may determine at time t1 that power amplifier 220 is operating in saturation at time t1. Based on the determination that power amplifier 220 is operating in or near saturation, saturation detector 244 may direct amplifier controller 248 to reduce the bias voltage such that amplifier 220 is not operating in or near saturation. For example the bias voltage may be adjusted such that amplifier 220 is operating in the linear slope state instead of the low slope state.

In some embodiments, saturation detector 244 may be configured to delay directing amplifier controller 248 to reduce the bias voltage upon determining that the slope energy at time t1 is less than the threshold. Saturation detector 244 may do so to ensure that amplifier 220 is in fact operating in saturation and that the low slope energy was not a random aberration. Additionally, saturation detector 244 may delay directing amplifier 220 to lower the bias voltage to see if the bias voltage may be lowered by amplifier control unit 248 based on another signal received by amplifier control unit 248 (e.g., a signal received from digital circuitry 202).

In the present example, upon an initial determination that amplifier 220 is operating in saturation, saturation detector 244 may be configured to wait for three more perturbations to occur (e.g., perturbations at times t2, t3 and t4) where amplifier 220 operating in or near saturation before directing amplifier controller 248 to reduce the bias voltage. Therefore, in the present example, saturation detector 244 may determine that amplifier 220 is in saturation at times t2, t3, and t4 based on the threshold and the slope energy at times t2, t3 and t4, (associated with changes in the RF signal based on the bias voltage perturbations at these times) before directing amplifier controller 248 to lower the bias voltage. It is understood that in alternative embodiments, saturation detector 244 may wait for a longer or shorter period of time upon detecting saturation before instructing amplifier controller 248 to reduce the bias voltage.

At time t5, based on instructions received from saturation detector 244, amplifier controller 248 may lower the bias voltage of amplifier 220, as shown by $V_{Bias}$. The signal power may also be reduced at time t5 based on the reduction in the bias voltage, however, because amplifier 220 was previously in saturation, the reduction in the signal power may be relatively small compared to the reduction in the bias voltage, as shown by $RF_{Power}$ at time t5. The slope energy corresponding with the reduction in the bias voltage and signal power at time t5 may also be detected by saturation detector 244 but is not explicitly shown with respect to $|RF_{Change}|$ of FIG. 4.

At time t6, another perturbation may be introduced to the bias voltage, and the measured RF power may accordingly increase. It can be seen that the increase in the RF power may be somewhat greater at time t6 than at times t1 and t3, indicating that amplifier 220 may be operating out of saturation. Additionally, the slope energy at time t6 may be substantially higher than the threshold, thus indicating that amplifier 220 is not operating in saturation. Based on the slope energy being higher than the threshold, saturation detector 244 may cease directing amplifier controller 248 to reduce the bias voltage of amplifier 220.

Therefore, saturation detector 244 may be configured to determine the slope energy of an RF signal, with the slope energy being associated with the change in the RF signal based on perturbations of the bias voltage of amplifier 220. Further, according to the slope energy, saturation detector 244 may be configured to determine when amplifier 220 is operating in or near saturation and may be configured to direct amplifier controller 248 to reduce the bias voltage of amplifier 220 such that amplifier 220 operates away from saturation or near saturation.

Modifications, additions or omissions may be made to FIG. 4 without departing from the scope of the present disclosure. For example, although the reduction in the bias voltage is shown as a single step, it is understood that the bias voltage may be reduced in a series of incremental steps. Additionally, in some of those embodiments, the slope energy of a perturbation may be measured after each step to determine if amplifier 220 is operating outside of saturation before decreasing the bias voltage by another step. Additionally, the value of the threshold may be modified according to design parameters and needs. For example, in some embodiments the threshold may be set such that it is associated with a slope energy that indicates that power amplifier 220 is operating near saturation. In other embodiments, the threshold may be set such that it is associated with a slope energy that indicates that power amplifier 220 is operating in saturation.

Returning to FIG. 2a, saturation detector 244 may comprise hardware, software, firmware or any combination thereof configured to determine whether amplifier 220 is operating in saturation. Similar to amplifier controller 248, saturation detector 244 may include without limitation a microprocessor, microcontroller, digital signal processor (DSP), application specific integrated circuit (ASIC), or any other digital or analog circuitry configured to interpret and/or execute program instructions and/or process data. In some embodiments saturation detector 244 may interpret and/or execute program instructions and/or process data (e.g., amplifier 220 saturation detection instructions) stored in memory communicatively coupled to saturation detector 244 (not expressly shown).

Figure 5:
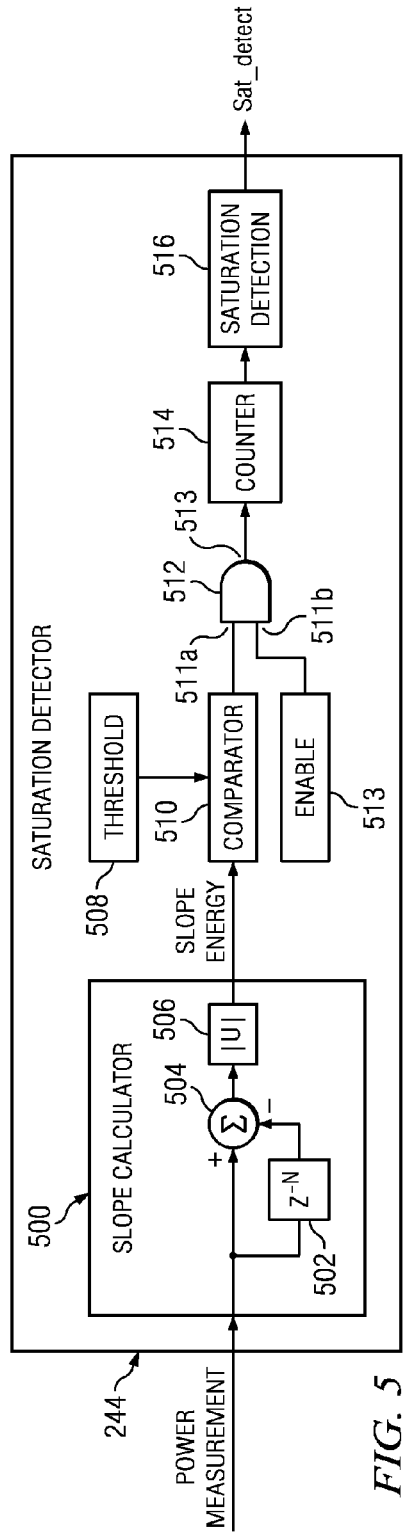
FIG. 5 illustrates an example block diagram of a power amplifier saturation detector in accordance with certain embodiments of the present disclosure.

FIG. 5 illustrates an example block diagram of saturation detector 244 including components configured to perform one or more of the operations of saturation detector 244 as described above.

Saturation detector 244 may include a slope energy calculator 500 configured to determine a change in RF signal power measured by signal measurement path 242. As mentioned above, signal measurement path 242 may measure the RF signal and may generate a digitized signal indicating the RF signal power. Slope calculator 500 may be configured to receive the digitized signal from measurement path 242. Due to the digital nature of the received signal, slope energy calculator 500 may receive digital samples of values indicating the signal power. Slope energy calculator 500 may be configured to store a previous sample 502 of the digitized measurement signal corresponding with the signal measurement sample received before receiving a current sample.

Slope energy calculator 500 may be configured to determine the difference between the previous sample 502 and the current sample using a summer 504 included in slope energy calculator 500. The difference in the samples may indicate a change in the RF signal between samples. As mentioned previously, the change may be an increase or a decrease in the RF signal power, and the degree of the change in the RF signal with respect to the degree of change of a bias voltage may indicate the operating state of power amplifier 220. Accordingly, slope energy calculator 500 may include an absolute value unit 506 coupled to summer 504 and configured to receive the change in the RF signal from summer 504. Absolute value unit 506 may be configured to determine the absolute value of the difference in the RF signal measurements to generate a signal indicating the change in the RF signal, regardless of whether the RF signal experiences an increase or decrease.

After leaving absolute value unit 506, the digital signal indicating the slope energy of the change in the RF signal may leave slope energy calculator 500 and may be communicated to a comparator 510 communicatively coupled to absolute value unit 506 and included in saturation detector 244. Comparator 510 may also be configured to receive a threshold value 508 associated with a slope energy (associated with a perturbation in the bias voltage) that indicates that power amplifier 220 is operating in or near saturation.

Comparator 510 may be configured to compare threshold 208 with the slope energy received from slope energy calculator 500. If the slope energy is less than threshold 208 (indicating that amplifier 220 is operating in or near saturation), comparator 510 may communicate a "HIGH" signal to an input terminal 511a of an AND gate 512 that may be communicatively coupled to comparator 510 at input terminal 511a and included in saturation detector 244. If the slope energy is greater than threshold 208 (indicating that amplifier 220 is operating outside of saturation), comparator 510 may communicate a "LOW" signal to input terminal 511a of AND gate 512.

AND gate 512 may also include an input terminal 511b communicatively coupled to an enable signal 513 that may be set "HIGH" when saturation detector 244 is in operation and enabled. Accordingly, when AND gate 512 is enabled and saturation is detected such that a "HIGH" signal is sent to input terminal 511a from comparator 510, AND gate 512 may output a "HIGH" signal at an output terminal 515 of AND gate 512. Further, when AND gate 512 is enabled and saturation is not detected such that a "LOW" signal is sent to input terminal 511a from comparator 510, AND gate 512 may output a "LOW" signal at output terminal 515. Output terminal 515 may be communicatively coupled to a counter 514 included in saturation detector 244.

Counter 514 may comprise any suitable system, apparatus or device configured to increment a value with every clock cycle of a clock associated with saturation detector 244 when activated. In the present embodiment, counter 514 may be activated upon receiving a "HIGH" signal from output terminal 515 of AND gate 512, indicating that amplifier 220 may be operating in or near saturation. Counter 514 may be configured to stop incrementing and reset upon receiving a "LOW" signal from output terminal 515 of AND gate 512, indicating that amplifier 220 may be operating outside of saturation. Counter 514 may be communicatively coupled to a saturation detection unit 516 included in saturation detector 244. Counter 514 may be configured to communicate the counter value to saturation detection unit 516.

Saturation detection unit 516 may comprise any suitable system, apparatus, or device configured to determine whether the bias voltage of power amplifier 220 should be reduced based on power amplifier 220 operating in or near saturation. Saturation detection unit 516 may make this determination based on the counter value received from counter 514. In some embodiments, saturation detection unit 516 may comprise a comparator configured to compare the value of counter 514 with a clock cycle number indicating that an adjustment in the control signal (e.g., bias voltage) of amplifier 220 should be implemented. If the counter value corresponds with the clock cycle number, saturation detection unit 516 may communicate a signal (e.g., Sat_detect of FIG. 5) to amplifier controller 248 indicating that the bias voltage of power amplifier 220 should be reduced.

The clock cycle number may correspond with the number of clock cycles that may pass from the time that the slope energy is determined to be lower than the threshold until bias voltage adjustment is implemented. Accordingly, the clock cycle number may correspond with the amount of time that may pass until bias voltage adjustment may be implemented. The value of the clock cycle number may vary depending on design specifications and requirements.

Therefore, saturation detector 244 may be configured to determine that amplifier 220 is operating in or near saturation based on the slope energy of the RF signal amplified by power amplifier 220 and influenced by perturbations in the bias voltage of power amplifier 220. Additionally, saturation detector 244 may be configured to instruct amplifier controller 248 to reduce the bias voltage of power amplifier 220 according to the determination that power amplifier 220 is operating in or near saturation.

Modifications, additions or omissions may be made to saturation detector 244 without departing from the scope of the present disclosure. For example, although a specific digital processing system has been described, it is understood that any suitable system configured to perform similar operations as those described with respect to saturation detector 244 may be used. The present disclosure of saturation detector 244 in FIG. 5 is merely an example implementation that may be used.

Therefore, as mentioned previously, saturation detector 244 may comprise any suitable hardware, software, firmware or any combination thereof configured to determine whether amplifier 220 is operating in saturation. Saturation detector 244 may include without limitation a microprocessor, microcontroller, digital signal processor (DSP), application specific integrated circuit (ASIC), or any other digital or analog circuitry configured to interpret and/or execute program instructions and/or process data. In some embodiments saturation detector 244 may interpret and/or execute program instructions and/or process data (e.g., amplifier 220 saturation detection instructions) stored in memory communicatively coupled to saturation detector 244 (not expressly shown).

Returning to FIG. 2a, as mentioned above, in addition to saturation detector 244, control path 240 may include blocker detector 246 configured to determine whether a blocker of the transmitted RF signal is present. Blocker detector 246 may be communicatively coupled to signal measurement path 242 such that blocker detector 246 may receive the digitized measured RF signal, similar to saturation detector 244. Blocker detector 246 may also be communicatively coupled to the output of amplifier controller 248 such that blocker detector 246 may receive the amplifier control signal (e.g., bias voltage) from amplifier controller 248. Further, blocker detector 246 may be communicatively coupled to amplifier controller 248 and to digital circuitry 202 such that blocker detector 246 may instruct amplifier controller 248 and/or digital circuitry 202 that a blocker is present such that amplifier controller 248 and/or digital circuitry 202 may perform appropriate operations in relation to the detected blocker.

Blocker detector 246 may be configured to determine a change in the measured RF signal as received from signal measurement path 242. The change in the measured RF signal may be due to a perturbation in the control signal (e.g., bias voltage) of power amplifier 220. Blocker detector 246 may also be configured to determine the change in the control signal due to the perturbation in the control signal. Blocker detector 246 may be configured to compare the change in the measured RF signal with the change in the control signal. If the measured signal and the control signal do not experience a similar change (e.g., an increase in the control signal and an increase in the measured signal) at approximately the same time, blocker detector 246 may determine that a blocker is present. Therefore, blocker detector 246 may communicate to amplifier controller 248 and/or digital circuitry 202 that a blocker is present. In some embodiments, blocker detector 246 may communicate a signal indicating the presence of a blocker to digital circuitry 202 and digital circuitry 202 may communicate a signal and control signals indicating such to amplifier controller 248 instead of blocker detector 246 communicating the information directly to amplifier controller 248. Digital circuitry 202 and/or amplifier controller 248 may act accordingly.

For example, digital circuitry 202 may cease transmission of the RF signal until after receiving an indication from blocker detector 246 that the blocker is no longer present. Additionally, in the same or alternative embodiments, amplifier controller 248 may maintain or reduce the control signal to reduce unnecessary power consumption until receiving an indication from blocker detector 246 that the blocker is no longer present. Further, during blocker detection, digital circuitry 202 may be configured to delay power control updates made to digital and RF gain control stages. Further, antenna tuner updates may not be performed for the present transmission slot and saturation detection control updates may be delayed. Additionally, dynamic phase estimation circuitry of digital circuitry 202 may be put on a hold mode.

Blocker detector 246 may comprise hardware, software, firmware or any combination thereof configured to determine whether a blocker is present. Similar to amplifier controller 248 and saturation detector 244, blocker detector 246 may include without limitation a microprocessor, microcontroller, digital signal processor (DSP), application specific integrated circuit (ASIC), or any other digital or analog circuitry configured to interpret and/or execute program instructions and/or process data. In some embodiments blocker detector 246 may interpret and/or execute program instructions and/or process data (e.g., blocker detection instructions) stored in memory communicatively coupled to blocker detector 246 (not expressly shown).

Figure 6:
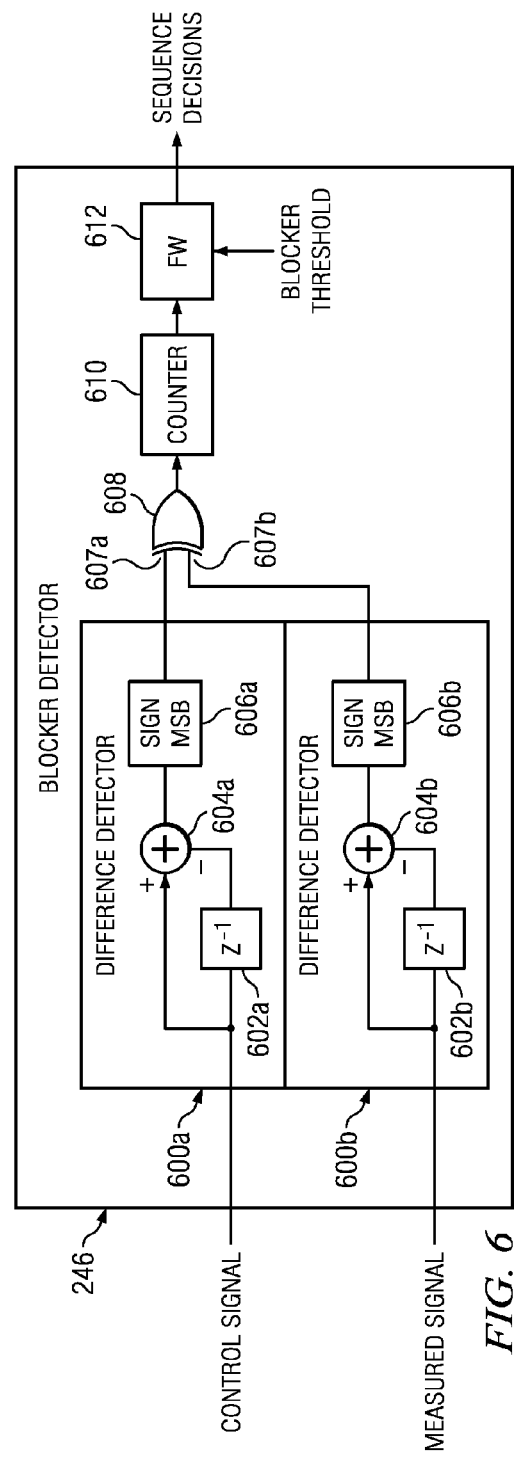
FIG. 6 illustrates an example block diagram of a wireless signal blocker detector in accordance with certain embodiments of the present disclosure.

FIG. 6 illustrates an example block diagram of blocker detector 246 including components configured to perform one or more of the operations of blocker detector 246 as described above. Blocker detector 246 may include difference detectors 600a and 600b configured to determine the difference between samples of digital signals received at detectors 600a and 600b.

In the present example, difference detector 600a may be configured to receive the digital control signal from amplifier controller 248 and difference detector 600b may be configured to receive the digital signal indicating the measured RF signal from signal measurement path 242. The control signal may act as a reference signal to compare against the measured signal to determine if a blocker is present.

Difference detector 600a may be configured to store a previous sample 602a of the control signal and difference detector 600b may be configured to store a previous sample 602b of the measured signal. Difference detector 600a may also include a summer 606a configured to determine the difference between previous sample 602a and the current sample of the control signal. Difference detector 600b may include a summer 606b similarly configured to determine the difference between previous sample 602b and the current sample of the measured signal.

Difference detectors 600a and 600b each include sign detectors 606a and 606b respectively. Sign detectors 606a and 606b may detect the sign of the values leaving summers 604a and 604b respectively. The sign of the values leaving summers 604a and 604b may respectively indicate if there is an increase, decrease or no change in the control signal and measured RF signal.

For example, an increase in the control signal may yield a positive difference between the current sample of the control signal and previous sample 602a of the control signal, thus the sign bit of the value leaving summer 604a may indicate a positive value of the difference as calculated by summer 604a (e.g., the sign bit may be "0"). No change between the current sample of the control signal and previous sample 602a may yield a value of zero from summer 604a, but may also have a positive sign bit (e.g., the sign bit may be "0"). Similarly, a decrease in the current sample of the control signal as compared to previous sample 602a may yield a negative value from summer 604a such that the sign bit of the value leaving summer 604a indicates a negative number (e.g., the sign bit may be "1"). The sign of the values leaving summer 604b may be similarly configured.

Sign detectors 606a and 606b may be communicatively coupled to input terminals 607a and 607b respectively of an exclusive or (XOR) gate 608 included in blocker detector 246. Accordingly, input terminals 607a and 607b may be set according to the sign bit as detected by sign detectors 606a and 606b respectively. For example, if sign detector 606a detects a sign bit of "1" indicating a decrease in the control signal, input terminal 607a of XOR gate 608 may be set "HIGH." Similarly, if sign detector 606a detects a sign bit of "0" indicating an increase or no change in the control signal, input terminal 607a of XOR gate 608 may be set "LOW." Input terminal 607b may be similarly set according to the sign bits detected by sign detector 606b.

XOR gate 608 may be configured to output a digital "1" or "HIGH" signal when the received signals at input terminals 607a and 607b are different, and may output a digital "0" or "LOW" signal when the received signals at input terminals 607a and 607b are the same. Accordingly, when the control signal and measurement signal are increasing, decreasing or staying the same at approximately the same time, the signals received at input terminals 607a and 607b may be the same such that XOR gate 608 may output a "LOW" signal. Similarly, when the control signal and measurement signal are not increasing, decreasing or staying the same at approximately the same time (indicating that blocker may be present), the signals received at input terminals 607a and 607b may not be same such that XOR gate 608 may output a "HIGH" signal. XOR gate 608 may be configured to communicate its outputted signal to a counter 610 communicatively coupled to XOR gate 608 and included in blocker detector 246.

In many instances, the increases and decreases in the control signal and the measured signal may be based on the periodic pulses or perturbations of the control signal such that the signals indicating the sign bits received by input terminals 607 of XOR gate 608 may be related to the perturbations or periodic pulses of the control signal. Therefore, by using XOR gate 608 to compare increases and decreases in the control signal and measured signal associated with the perturbations of the control signal, one or more blockers of the RF signal may be detected and indicated with a "HIGH" output signal of XOR gate 608.

Counter 610 may comprise any suitable system, apparatus or device configured to increment a value according to a clock driving counter 610 upon receiving a "HIGH" signal from XOR gate 608. Counter 610 may also be configured to maintain its value upon receiving a "LOW" signal from XOR gate 608. Accordingly, the value of counter 610 may increase in instances where the control signal and measured signal are not similarly increasing, decreasing or maintaining the same value at approximately the same time (indicating the presence of a blocker). Similarly, the value of counter 610 may stay the same in instances where the control signal and measured signal are similarly increasing, decreasing or maintaining the same value at approximately the same time. Counter 610 may be communicatively coupled to firmware 612 included in blocker detector 246 and may be configured to communicate the counter value to firmware 612.

Firmware 612 may be configured to receive the counter value from counter 610 and based on the changes in the counter value may determine that a blocker is present. In some embodiments, upon detecting a change in the counter value, firmware 612 may generate a signal indicating that a blocker is present. In alternative embodiments, firmware 612 may compare the number of changes in the counter value of counter 610 over a series of clock cycles and may compare that number with a blocker threshold. If the number of changes in the counter value over the series of clock cycles is greater than the blocker threshold, firmware 612 may generate the signal indicating that a blocker is present. In such embodiments, firmware 612 may ensure that a blocker is present for enough time that transmitted RF signal disruption may occur before generating a signal indicating the blocker. Firmware 612 may be communicatively coupled to amplifier controller 248 and/or digital circuitry 202 of FIGS. 2a and 2b (not expressly shown in FIG. 6) such that detector blocker 246 may communicate the signal indicating the presence of a blocker to amplifier controller 248 and/or digital circuitry 202 via firmware 612.

Therefore, FIG. 6 illustrates an example embodiment of blocker detector 246 configured to compare increases and decreases in the control signal (associated with perturbations of the control signal) of power amplifier 220 with increases and decreases in the measured RF signal to determine the presence of one or more blockers. Modifications, additions or omissions may be made to blocker detector 246 without departing from the scope of the present disclosure. For example, although a specific digital processing system has been described, it is understood that any suitable system configured to perform similar operations as those described with respect to blocker detector 246 may be used. The present disclosure of saturation blocker detector 246 in FIG. 6 is merely an example implementation that may be used.

Therefore, as mentioned previously, blocker detector 246 may comprise hardware, software, firmware or any combination thereof configured to determine whether a blocker is present. As such, blocker detector 246 may include without limitation a microprocessor, microcontroller, digital signal processor (DSP), application specific integrated circuit (ASIC), or any other digital or analog circuitry configured to interpret and/or execute program instructions and/or process data. In some embodiments blocker detector 246 may interpret and/or execute program instructions and/or process data (e.g., blocker detection instructions) stored in memory communicatively coupled to blocker detector 246 (not expressly shown).

Returning to FIG. 2a, from the above description it can be seen that control path 240 may be configured to determine saturation of power amplifier 220 and also detect blockers of RF signals amplified by power amplifier 220 and transmitted by antenna 218. Control path 240 may detect the saturation and blockers based on changes in the measured RF signal associated with perturbations in the control signal of power amplifier 220.

Modifications, additions, or omissions may be made to FIG. 2a without departing from the scope of the present disclosure. For example, although specific components are depicted, it is understood that element 200 may include components not specifically shown in FIG. 2a. Additionally, it is understood that element 200 may include more power amplifiers 200 and control paths 240 than those specifically depicted depending on the design specifications and characteristics of element 200. Further, in some embodiments control path 240 may include blocker detector 246, but not saturation detector 244, or vice versa.

Figure 7:
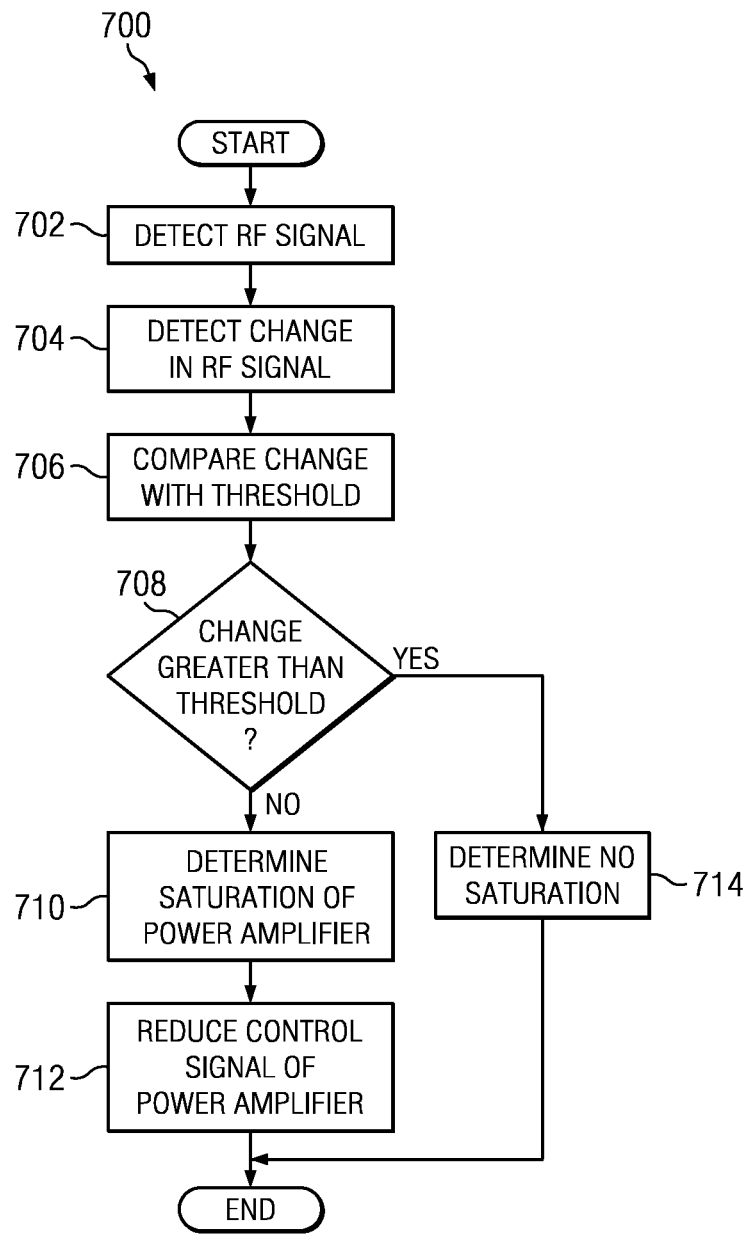
FIG. 7 illustrates an example method for detecting the saturation of a power amplifier configured to amplify a wireless communications signal in accordance with certain embodiments of the present disclosure.

FIG. 7 illustrates an example method 700 for detecting the saturation of a power amplifier configured to amplify a wireless communications signal. In certain embodiments, method 700 may be implemented partially or fully in software, firmware, or other logic embodied in tangible computer readable media. As used in this disclosure, "tangible computer readable media" means any instrumentality, or aggregation of instrumentalities that may retain data and/or instructions for a period of time. Tangible computer readable media may include, without limitation, random access memory (RAM), read-only memory (ROM), electrically erasable programmable read-only memory (EEPROM), a PCMCIA card, flash memory, direct access storage (e.g., a hard disk drive or floppy disk), sequential access storage (e.g., a tape disk drive), compact disk, CD-ROM, DVD, and/or any suitable selection of volatile and/or non-volatile memory and/or a physical or virtual storage resource. In the present example, one or more steps of method 700 may be performed by one or more components of a control path of a wireless communications element such as control path 240 described with respect to FIG. 2a.

Method 700 may start, and at step 702 the control path may detect a wireless communications signal (e.g., an RF signal) amplified by a power amplifier coupled to the control path and transmitted by an antenna of a wireless communications device associated with the control path. In some instances, a signal measurement path of the control path such as signal measurement path 242 of FIG. 2a may perform step 702. In other embodiments, a feedback receive path such as described with respect to FIG. 2b may perform step 702.

At step 704, the control path may detect a change in power of the measured wireless signal. The change in the power of the measured signal may be associated with a perturbation of a control signal (e.g., bias voltage) configured to drive the gain of a power amplifier amplifying the wireless signal. Additionally, as mentioned previously, the magnitude of the change in the power of the measured signal may be referred to as the slope energy of the measured signal. In the present example, a saturation detector of the control path such as saturation detector 244 of FIGS. 2a, 2b and 5 may perform step 704.

At step 706, the control path (e.g., saturation detector of the control path) may compare the change in the measured signal with a threshold value. The threshold may indicate a degree of change in power or slope energy of the measured signal associated with the perturbation in the control signal that may also be associated with the power amplifier operating in or near saturation. At step 708, the control path (e.g., saturation detector of the control path) may determine whether the change in the signal power is greater than the threshold. If the change is greater than the threshold, the control path may proceed to step 714 of method 700 and determine that the amplifier is not operating in or near saturation (e.g., the amplifier may be operating in the linear slope or high slope states). Following step 714, method 700 may end.

If at step 708 the change in measured power is less than the threshold, the control path (e.g., saturation detector of the control path) may determine, at step 710, that the power amplifier is operating in or near saturation. Accordingly, at step 712, the control path may reduce the control signal of the power amplifier, such that the power amplifier is operating outside of saturation. For example, as described above, a saturation detector may communicate a signal to an amplifier controller (both included in the control path) and the amplifier controller may reduce the control signal (e.g., bias voltage) of power amplifier 220 such that amplifier 220 is operating sufficiently outside of saturation. Following step 712, method 700 may end. Therefore, method 700 may be used to detect that a power amplifier is operating in or near saturation and the control signal of the power amplifier may be adjusted such that the power amplifier operates sufficiently away from saturation to conserve power and increase efficiency.

Modifications, additions, or omissions may be made to method 700 without departing from the scope of the present disclosure. For example, although the steps are described as being performed in a particular order in some instances one or more steps may be performed in a different time or more than one step may be performed at the same time. As an example, a step indicating waiting a period of time upon detecting saturation before adjusting the control signal (such as done by counter 514 in FIG. 5) may be added to method 700 without departing from the scope of method 700.

Figure 8:
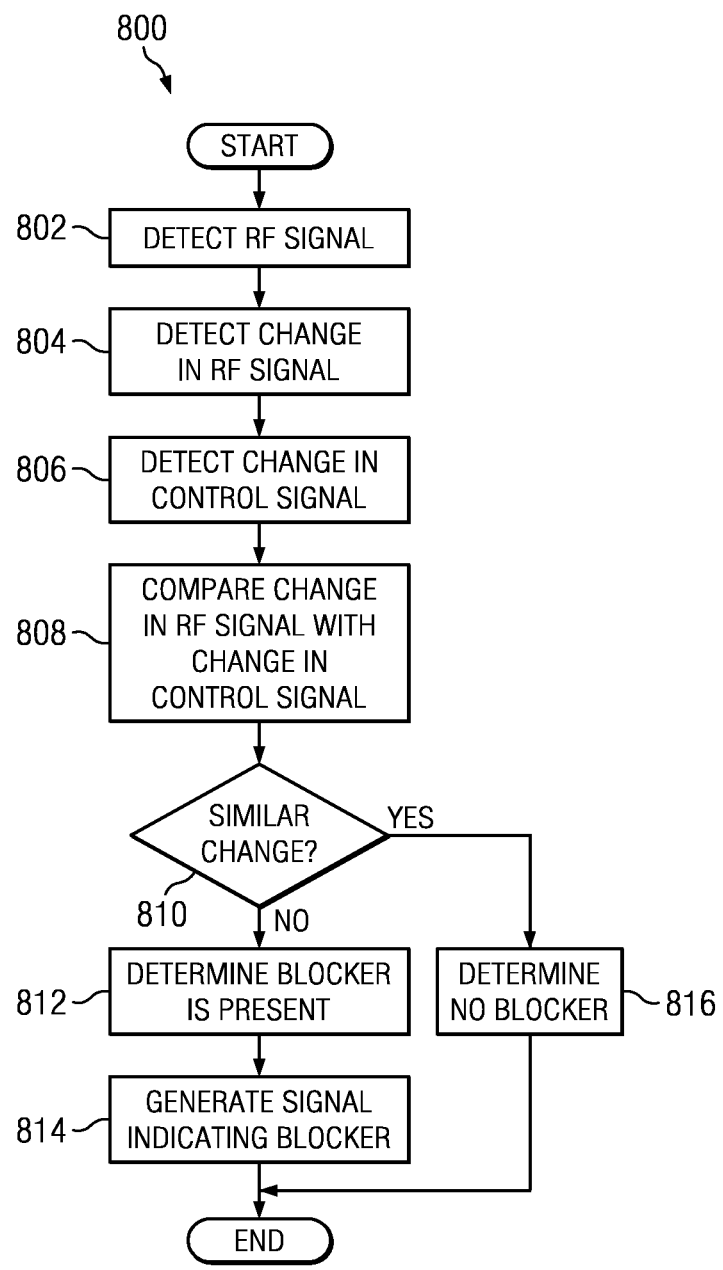
FIG. 8 illustrates an example method for detecting a blocker of a wireless communication signal in accordance with certain embodiments of the present disclosure.

FIG. 8 illustrates an example method 800 for detecting a blocker of a wireless communications signal. In certain embodiments, method 800 may be implemented partially or fully in software, firmware, or other logic embodied in tangible computer readable media. In the present example, one or more steps of method 800 may be performed by one or more components of a control path of a wireless communications element, such as control path 240 described with respect to FIG. 2a.

Method 800 may start, and at step 802 the control path may detect a wireless communications signal (e.g., an RF signal) amplified by a power amplifier coupled to the control path and transmitted by an antenna of a wireless communications device associated with the control path. In some instances, a signal measurement path of the control path such as signal measurement path 242 of FIG. 2a may perform step 802. In other embodiments, a feedback receive path such as described with respect to FIG. 2b may perform step 802.

At step 804, the control path may detect a change in power of the measured wireless signal. The change in the power of the measured signal may be associated with a perturbation of a control signal (e.g., bias voltage) of the power amplifier configured to amplify the wireless signal. In the present example, a blocker detector of the control path such as blocker detector 246 of FIGS. 2a, 2b, and 6 may perform step 804. At step 806, the control path (e.g., a blocker detector of the control path) may detect the change in the control signal associated with the perturbation of the control signal.

At step 808, the control path (e.g., a blocker detector of the control path) may compare the change in the measured signal with the change in the control signal. In some embodiments, the control path may compare the changes to determine whether similar changes occur in the measured wireless signal and the control signal at approximately the same time at step 810 (e.g., increases, decreases, no change, such as described with respect to FIG. 6).

At step 810, the control path may determine whether similar changes are occurring in the measured signal and the control signal at approximately the same time. If similar changes are not occurring, method 800 may proceed to step 812. If similar changes are occurring, method 800 may proceed to step 816.

At step 812, due to the changes not being similar, the control path (e.g., blocker detector of the control path) may determine that a blocker is present. At step 814, the control path (e.g., blocker detector of the control path) may generate a signal indicating that a blocker is present. In some embodiments an additional step may be included where the blocker may be detected for a period of time as defined by a blocker threshold before the signal indicating the blocker is generated. The signal indicating a blocker may be sent to an amplifier controller and/or digital circuitry of a wireless communication element as described with respect to FIG. 2a. The amplifier controller and/or digital circuitry may perform various operations such as those described above in response to a blocker being detected. Following step 814, method 800 may end.

At step 816, due to similar changes in control signal and the measured signal being detected at approximately the same time, as determined in step 810, the control path may determine that no blocker is present. Accordingly, the control path may not direct any operations associated with the presence of a blocker and method 800 may end.

Modifications, additions, or omissions may be made to method 800 without departing from the scope of the present disclosure. For example, although the steps are described as being performed in a particular order in some instances one or more steps may be performed in a different time or more than one step may be performed at the same time.

Although the present disclosure and its advantages have been described in detail, it should be understood that various changes, substitutions and alterations can be made herein without departing from the spirit and scope of the disclosure as defined by the following claims.

What is claimed is:

1. A wireless communication element comprising:
   a transmit path configured to convert a digital signal into a wireless communication signal, the transmit path including a power amplifier configured to amplify a power level of the wireless communication signal according to an amplifier control signal;
   an antenna coupled to the transmit path and configured to transmit the wireless communication signal; and
   a control path coupled to the antenna and the power amplifier, the control path configured to:
   sense one or more digital feedback signals indicative of the power level of the wireless communication signal transmitted from the transmit path to the antenna;
   determine a change in the power level based on the one or more digital feedback signals indicative of the power level, the change associated with one or more perturbations of the amplifier control signal; and adjust transmission of the wireless communication signal according to the change in the power level.

2. The wireless communication element of claim 1, wherein the control path is further configured to:
   determine that the power amplifier is operating in approximately a saturated state based on the change in the power level; and
   adjust the transmission of the wireless communication signal by adjusting the control signal in response to determining that the amplifier is operating in approximately the saturated state.

3. The wireless communication element of claim 2, wherein the control path is further configured to:
   compare the change in the power level with a threshold value; and
   determine that the power amplifier is operating in approximately the saturated state based on the comparison between the change in the power level and the threshold value.

4. The wireless communication element of claim 2, wherein the control path is further configured to delay adjusting the control signal for a period of time upon determining that the power amplifier is operating in approximately the saturated state.

5. The wireless communication element of claim 1, wherein the control path is further configured to:
   detect a blocker associated with the wireless communication signal based on the change in the power level; and
   adjust the transmission of the wireless communication signal in response to detecting the blocker.

6. The wireless communication element of claim 5, wherein the control path is further configured to:
   compare the change in the power level with a change in the control signal associated with the one or more perturbations of the control signal; and
   detect the blocker based on the comparison between the change in the power level and the change in the control signal.

7. The wireless communication element of claim 5, wherein the control path is further configured to delay adjusting the transmission of the wireless communication signal for a period of time upon detecting the blocker.

8. A wireless communication device configured to control transmission of a wireless communication signal comprising:
   an amplifier controller communicatively coupled to a power amplifier configured to amplify a power level of a wireless communication signal based on a gain of the power amplifier, the amplifier controller configured to:
      generate an amplifier control signal configured to control the gain of the power amplifier, the amplifier control signal including one or more perturbations; and
      communicate the amplifier control signal to the power amplifier;
   a signal measurement path communicatively coupled to the power amplifier and configured to:
      sense one or more digital feedback signals indicative of the power level of the wireless communication signal amplified by the power amplifier; and
      generate a digital measurement signal associated with the power level of the wireless communication signal based on the one or more digital feedback signals indicative of the power level; and
   a saturation detector communicatively coupled to the signal measurement path and configured to:
      receive the digital measurement signal from the signal measurement path;
      detect a change in the power level based on the digital measurement signal, the change associated with the one or more perturbations of the amplifier control signal; and
      determine that the power amplifier is operating in approximately a saturated state based on the change in the power level.

9. The wireless communication device of claim 8, wherein the saturation detector is further configured to:
   compare the change in the power level with a threshold value; and
   determine that the power amplifier is operating in approximately the saturated state based on the comparison between the change in the power level and the threshold value.

10. The wireless communication device of claim 8, wherein the saturation detector is communicatively coupled to the amplifier controller and further configured to communicate an amplifier adjustment signal to the amplifier controller in response to determining that the power amplifier is operating in approximately the saturated state, the amplifier adjustment signal indicating an adjustment in the amplifier control signal.

11. The wireless communication device of claim 10, wherein the saturation detector is further configured to delay communicating the amplifier adjustment signal for a period of time upon determining that the power amplifier is operating in approximately the saturated state.

12. A wireless communication device configured to control transmission of a wireless communication signal comprising:
   an amplifier controller communicatively coupled to a power amplifier configured to amplify a power level of a wireless communication signal based on a gain of the power amplifier, the amplifier controller configured to:
      generate an amplifier control signal configured to control the gain of the power amplifier, the amplifier control signal including one or more perturbations; and
      communicate the amplifier control signal to the power amplifier;
   a signal measurement path communicatively coupled to the power amplifier and configured to:
      sense one or more digital feedback signals indicative of the power level of the wireless communication signal amplified by the power amplifier; and
      generate a digital measurement signal associated with the power level of the wireless communication signal based on the one or more digital feedback signals indicative of the power level; and
   a blocker detector communicatively coupled to the signal measurement path and configured to:
      receive the digital measurement signal from the signal measurement path;
      detect a change in the power level based on the digital measurement signal, the change associated with the one or more perturbations of the amplifier control signal; and
      detect a blocker associated with the wireless communication signal based on the change in the power level.

13. The wireless communication device of claim 12, wherein the blocker detector is further configured to:
   compare the change in the power level with a change in the control signal associated with the one or more perturbations of the control signal; and detect the blocker based on the comparison between the change in the power level and the change in the control signal.

14. The wireless communication device of claim 12, wherein the blocker detector is further configured to adjust transmission of the wireless communication signal in response to detecting the blocker.

15. The wireless communication device of claim 14, wherein the blocker detector is further configured to delay adjusting the transmission of the wireless communication signal for a period of time upon detecting the blocker.

16. The wireless communication device of claim 14, wherein the blocker detector is configured to adjust transmission of the wireless communication signal by delaying transmission of the wireless communication signal.

17. A method in a wireless communication device for controlling transmission of a wireless communication signal comprising:
sensing one or more digital feedback signals indicative of a power level of a wireless communication signal, the power level of the wireless communication signal amplified by a power amplifier according to an amplifier control signal;
determining a change in the power level based on the one or more digital feedback signals indicative of the power level, the change associated with one or more perturbations of the amplifier control signal; and
adjusting transmission of the wireless communication signal according to the change in the power level.

18. The method of claim 17, further comprising:
determining that the power amplifier is operating in approximately a saturated state based on the change in the power level; and
adjusting the transmission of the wireless communication signal by adjusting the control signal in response to determining that the amplifier is operating in approximately the saturated state.

19. The method of claim 18, further comprising:
comparing the change in the power level with a threshold value; and
determining that the power amplifier is operating in approximately the saturated state based on the comparison between the change in the power level and the threshold value.

20. The method of claim 18, further comprising delay adjusting the control signal for a period of time upon determining that the power amplifier is operating in approximately the saturated state.

21. The method of claim 17, further comprising:
detecting a blocker associated with the wireless communication signal based on the change in the power level; and
adjusting the transmission of the wireless communication signal in response to detecting the blocker.

22. The method of claim 21, further comprising:
comparing the change in the power level with a change in the control signal associated with the one or more perturbations of the control signal; and
detecting the blocker based on the comparison between the change in the power level and the change in the control signal.

23. The method of claim 21, further comprising delaying adjusting the transmission of the wireless communication signal for a period of time upon detecting the blocker.

24. The method of claim 17, wherein adjusting the transmission of the wireless communication signal comprises delaying transmission of the wireless communication signal.

* * * * *